United States Patent
Chen et al.

(10) Patent No.: US 11,037,374 B2
(45) Date of Patent: Jun. 15, 2021

(54) COLLABORATIVE GEOGRAPHICAL MODELING PLATFORM INTEGRATING VIRTUAL OBJECTS AND PHYSICAL OBJECTS

(71) Applicant: Nanjing Normal University, Jiangsu (CN)

(72) Inventors: Min Chen, Nanjing (CN); Guonian Lv, Nanjing (CN); Songshan Yue, Nanjing (CN); Teng Zhong, Nanjing (CN); Yongning Wen, Nanjing (CN)

(73) Assignee: Nanjing Normal University, Nanjing (CN)

(*) Notice: Subject to any disclaimer, the term of this patent is extended or adjusted under 35 U.S.C. 154(b) by 0 days.

(21) Appl. No.: 16/689,447

(22) Filed: Nov. 20, 2019

(65) Prior Publication Data
US 2021/0150820 A1  May 20, 2021

(51) Int. Cl.
G06T 19/20 (2011.01)
H04L 29/06 (2006.01)
(Continued)

(52) U.S. Cl.
CPC .............. *G06T 19/20* (2013.01); *G06F 16/29* (2019.01); *G06F 30/13* (2020.01); *H04L 65/4053* (2013.01)

(58) Field of Classification Search
None
See application file for complete search history.

(56) References Cited

U.S. PATENT DOCUMENTS 7,535,473 B2  5/2009 Antoine
7,895,020 B2  2/2011 Sickels et al.
(Continued)

FOREIGN PATENT DOCUMENTS

CN  101901291 B  1/2013
CN  102707949 B  1/2015
CN  105204631 B  11/2017

OTHER PUBLICATIONS

Mark Anderson, "Samsung SUR40 with Microsoft Pixel Sense", https://hometoys.com/samsung-sur40-with-microsoft-pixel-sense/, 2012. (Year: 2012).*

(Continued)

*Primary Examiner* — Nicholas R Wilson
(74) *Attorney, Agent, or Firm* — Saliwanchik, Lloyd & Eisenschenk

(57) ABSTRACT

A collaborative geographical modeling/simulating system and methods are provided for integrating virtual and physical objects. The collaborative geographical modeling/simulating system includes a geographical conceptual modeling device having a plurality of physically operable micro-geographical objects and a plurality of physically operable micro-data objects; and a collaborative control device coupled to the geographical conceptual modeling device and having a resource module having a plurality of virtual resource items and a management module to perform geographical analysis, geographical model construction, and geographical model simulation. The plurality of physically operable micro-geographical objects and the plurality of physically operable micro-data objects are associated with corresponding virtual resource items of the plurality of virtual resource items for the geographical analysis, geographical model construction, and geographical model simulation.

20 Claims, 8 Drawing Sheets

(51) Int. Cl.
   *G06F 16/29*        (2019.01)
   *G06F 30/13*        (2020.01)

(56) References Cited

U.S. PATENT DOCUMENTS

| | | |
|---|---|---|
| 8,671,110 B1 | 3/2014 | Mosterman et al. |
| 2012/0208153 A1 | 8/2012 | Bolla et al. |
| 2015/0161904 A1 | 6/2015 | Beck et al. |
| 2020/0027256 A1* | 1/2020 | Simpkinson ....... G02B 27/0179 |

OTHER PUBLICATIONS

Agudelo, C. G. et al., "TipChip: a modular, MEMS-based platform for experimentation and phenotyping of tip-growing cells," *The Plant Journal*, 2013, 73:1057-1068, 2012 Blackwell Publishing Ltd.

* cited by examiner

COLLABORATIVE GEOGRAPHICAL MODELING PLATFORM INTEGRATING VIRTUAL OBJECTS AND PHYSICAL OBJECTS

BACKGROUND OF THE INVENTION

Geographical environment contains a large number of complex elements such as atmosphere, water, soil, vegetation, and buildings. Human depends on the geographical environment for daily living and changes the geographical environment by activities including building bridges, expanding cities and planting crops at the same time.

Geo-modeling methods are useful for analyzing the geographical environment and identifying characteristics of various geographical elements of the geographical environment. However, the existing geo-modeling methods either only use physical media such as blackboard or paper to support users to collaboratively solve geographical issues, or only allow the users to create virtual objects on a computing device to analyze the geographical environment.

For varied tasks of geographical analysis, geographical model construction and geographical model simulation, these isolated methods based only on physical objects or only on virtual objects are limited for the users dispersed in different places and having knowledge of multiple disciplines or multiple scientific fields.

BRIEF SUMMARY OF THE INVENTION

There continues to be a need in the art for improved designs and techniques for a geographical modeling/simulation platform that integrates both virtual objects and physical objects to enable the users of different fields to effectively perform analysis of the geographical environment.

Embodiments of the subject invention pertain to a collaborative geographical platform integrating virtual objects and physical object for geographical analysis, geographical model construction, and geographical model simulation.

According to an embodiment of the invention, the collaborative geographical modeling/simulating system can comprise a geographical conceptual modeling device comprising a plurality of physically operable micro-geographical objects and a plurality of physically operable micro-data objects; and a collaborative control device coupled to the geographical conceptual modeling device, comprising a resource module having a plurality of virtual resource items and a management module. The plurality of physically operable micro-geographical objects and the plurality of physically operable micro-data objects can be configured to be associated with corresponding virtual resource items of the plurality of virtual resource items. Moreover, the geographical conceptual modeling device can be configured to transmit operation information of both the micro-geographical objects and the micro-data objects to the management module. Furthermore, the management module can be configured to receive the operation information from the geographical conceptual modeling device, retrieve resource information of the virtual resource items from the resource module, and perform geographical analysis, geographical model construction, and geographical model simulation based on the operation information and the resource information.

In another embodiment, a method for a collaborative geographical modeling/simulating system that comprises a geographical conceptual modeling device comprising a plurality of physically operable micro-geographical objects and a plurality of physically operable micro-data objects, a collaborative control device coupled to the geographical conceptual modeling device and comprising a resource module having a plurality of virtual resource items and a management module is provided. The method comprises associating the plurality of physically operable micro-geographical objects and the plurality of physically operable micro-data objects with corresponding virtual resource items of the plurality of virtual resource items; transmitting, by the geographical conceptual modeling device, information of operations of both the micro-geographical objects and the micro-data objects to the management module; receiving, by the management module, the operation information from the geographical conceptual modeling device; retrieving, by the management module, resource information of the virtual resource items from the resource module; and performing, by the management module, geographical analysis, geographical model construction, and geographical model simulation based on the operation information and the resource information.

In some embodiments, the collaborative geographical modeling/simulating system can further comprise at least one participant device coupled to the collaborative control device. Moreover, the management module can be configured to transmit results of the geographical analysis, the geographical model construction, and the geographical model simulation to the at least one participant device, the at least one participant device can be configured to receive the results of the geographical analysis, the geographical model construction, and the geographical model simulation and visually present the results on the display. Furthermore, the at least one participant device can be configured to dynamically provide information to the resource module or the management module of the collaborative control device for adjusting and optimizing performance of the geographical analysis, the geographical model construction, and the geographical model simulation.

In certain embodiments, the plurality of virtual resource items can comprise at least one geographical cognition item, at least one geographical rule item, at least one drawing item, at least one model item, and at least one data item. Moreover, the at least one geographical cognition item, the at least one geographical rule item, and the at least one drawing item can be mutually attached to one another. Furthermore, the geographical cognition item can be bound to the model item or the data item; the geographical rule item is bound to the model item or the data item; and the drawing item is bound to the model item or the data item.

DETAILED DISCLOSURE OF THE INVENTION

Embodiments of the subject invention relate to advantageous collaborative geographical modeling/simulating systems, methods of operating the same, and methods of using the same.

Figure 1:
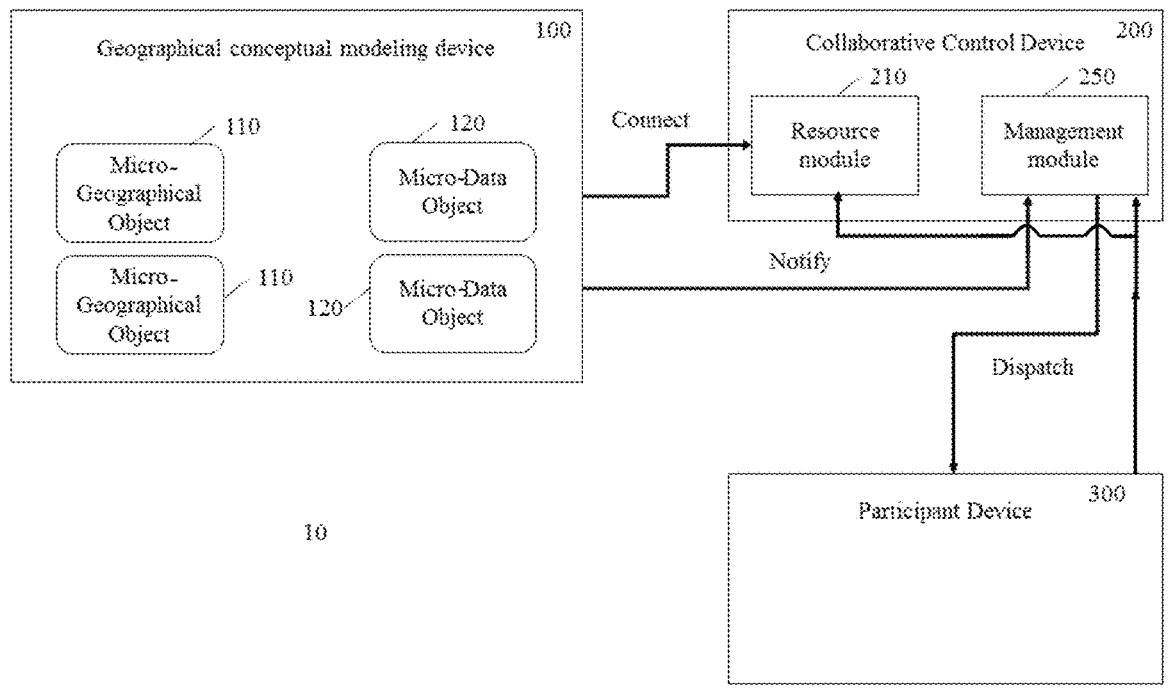
FIG. 1 is a schematic diagram of a collaborative geographical modeling/simulating system according to an embodiment of the subject invention.

In some embodiments, a collaborative geographic modeling/simulating system can be configured to, and/or used for, integrating physical objects representing geographical elements and virtual objects corresponding to the physical objects and performing geographical analysis, geographical model construction, and geographical model simulation based on the results of the integration. Referring to FIG. 1, the collaborative geographic modeling/simulating system 10 can comprise a geographical conceptual modeling device 100, a collaborative control device 200, and at least one participant device 300. To represent and express various geographical elements of real-world geographical environments, the geographical conceptual modeling device 100 can comprise a plurality of physically operable micro-geographical objects 110 and a plurality of physically operable micro-data objects 120. The geographical conceptual modeling device 100 is coupled to the collaborative control device 200 for transmitting information of operations of the plurality of micro-geographical objects 110 and the plurality of micro-data objects 120 from the geographical conceptual modeling device 100 to the collaborative control device 200.

As illustrated by FIG. 1, the collaborative control device 200 can comprise a resource module 210 including a plurality of virtual resource items for geographical analysis and a management module 250 for geographical model construction and geographical model simulation. The plurality of micro-geographical objects 110 and the plurality of micro-data objects 120 of the geographical conceptual modeling device 100 can be configured to be associated with the virtual resource items of the resource module 210 of the collaborative control device 200.

When the information of the operations of the plurality of micro-geographical objects 110 and the plurality of micro-data objects 120 is transmitted from the geographical conceptual modeling device 100 to the management module 250 of the collaborative control device 200, the management module 250 is configured to receive the operation information, retrieve resource information of virtual resource items from the resource module 210, and perform geographical analysis, geographical model construction, and geographical model simulation based on the operation information and the resource information.

Referring again to FIG. 1, the at least one participant device 300 is coupled to the collaborative control device 200 such that the collaborative control device 200 can transmit the results of the geographical analysis, the geographical model construction, and the geographical model simulation to the at least one participant device 300. When receiving the results from the collaborative control device 200, the at least one participant device 300 is configured to visualize the results and visually present the results on a display.

In one embodiment, the at least one participant device 300 can be configured to dynamically provide information to the resource module 210 or the management module 250 of the collaborative control device 200 for adjusting and optimizing performance of the geographical analysis, the geographical model construction, and the geographical model simulation of the collaborative geographic modeling/simulating system 10.

Figure 2:
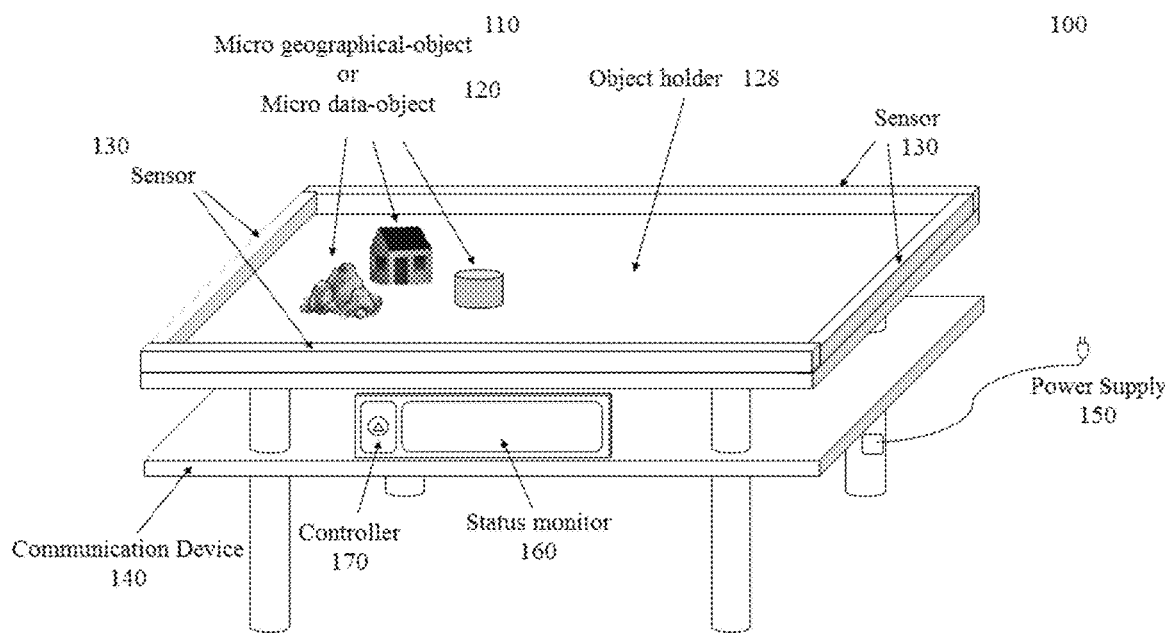
FIG. 2 is a schematic diagram of a geographical conceptual modeling device of the collaborative geographical modeling/simulating system according to an embodiment of the subject invention.

FIG. 2 is a schematic diagram of the geographical conceptual modeling device 100 according to an embodiment of the subject invention. The geographical conceptual modeling device 100 can comprise a plurality of micro-geographic objects 110; a plurality of micro-data objects 120; an object holder 128 such as a table upon which the plurality of micro-geographic objects 110 and the plurality of microdata objects 120 can be disposed; one or more sensors 130 for sensing the status, actions, movements, or operations of both the plurality of micro-geographical objects 110 and the plurality of micro-data objects 120; a communication device 140 for transmitting information of the operation of the plurality of micro-geographical objects 110 and the plurality of micro-data objects 120 to the collaborative control device 200; a power supply 150 for providing power to the geographical conceptual modeling device 100; a status monitor 160 for monitoring statuses of the plurality of micro-geographic objects 110 and the plurality of microdata objects 120; and a controller 170 for controlling the statuses, actions, movements, or operations of the micro-geographical objects 110 and the micro-data objects 120.

In one embodiment, the sensors 130 can sense the positions of the plurality of micro-geographical objects 110 and the plurality of micro-data objects 120 with respect to the object holder 128 and determine whether the the micro-geographical objects 110 and the micro-data objects 120 exceed the boundary of the object holder 128. If any of the micro-geographical objects 110 and the micro-data objects 120 exceeds the boundary of the object holder 128, this information is transmitted to the controller 170 to adjust the operations of the corresponding micro-geographical object 110 or the micro-data objects 120 to confine the micro-geographical object 110 or the micro-data objects 120 within the the boundary of the object holder 128.

Figure 3:
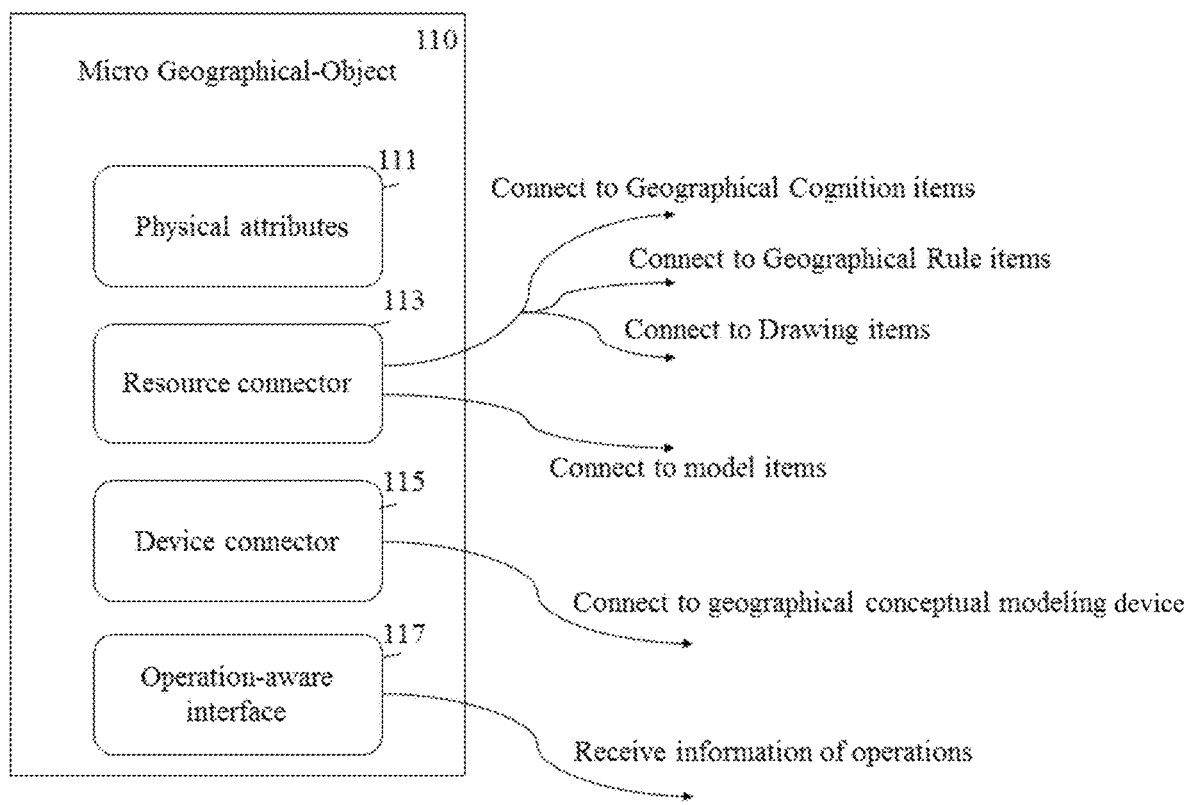
FIG. 3 is a schematic diagram of a micro-geographical object of the geographical conceptual modeling device according to an embodiment of the subject invention.
Figure 4:
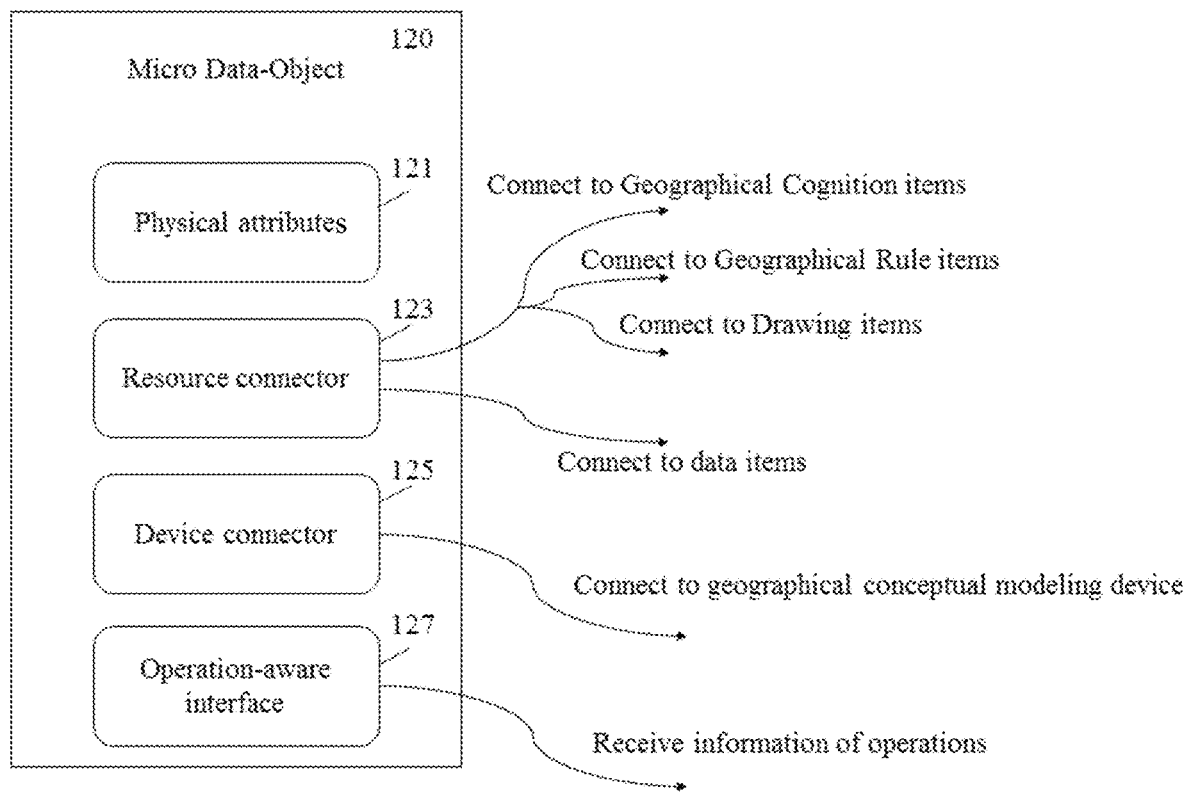
FIG. 4 is a schematic diagram of a micro-data object of the geographical conceptual modeling device according to an embodiment of the subject invention.

The object holder 128 can comprise one or more operation sensors (not shown) that can be associated with the micro-geographical objects 110 and the plurality of micro-data objects 120 through a device connector 115 of the micro-geographical objects 110 shown in FIG. 3 or a device connector 125 of the micro-data objects 120 shown in FIG. 4 for the physical deployment of the micro-geographical objects 110 and the micro-data objects 120 on the object holder 128.

Information of the operations of the micro-geographical objects 110 or the micro-data objects 120 is transmitted to a physical deployment device (not shown) through the device connector 115 or 125 of the micro-geographical objects 110 and the micro-data objects 120, respectively.

The object holder 128 acquires the information of the operations of the micro-geographical objects 110 and the micro-data objects 120 by the operation sensors (not shown) and transmits the information, through the communication device 140, to the collaborative control device 200 for the geographical analysis, the geographical model construction, and the geographical model simulation.

As illustrated by FIG. 3, each micro-geographical object 110 of the geographical conceptual modeling device 100 can comprise one or more physical attributes 111, a resource connector 113, a device connector 115, and an operation-aware interface 117.

The physical attributes 111 of the micro-geographical object 110 can comprise geographical information such as shape attributes, material attributes, color attributes, texture attributes, weight attributes, electromagnetic field attributes, or sensor attributes. When the micro-geographic object 110 is disposed on the geographical conceptual modeling device 100, the physical attributes 111 of the micro-geographical object 110 are registered with the geographical conceptual modeling device 100.

Figure 5:
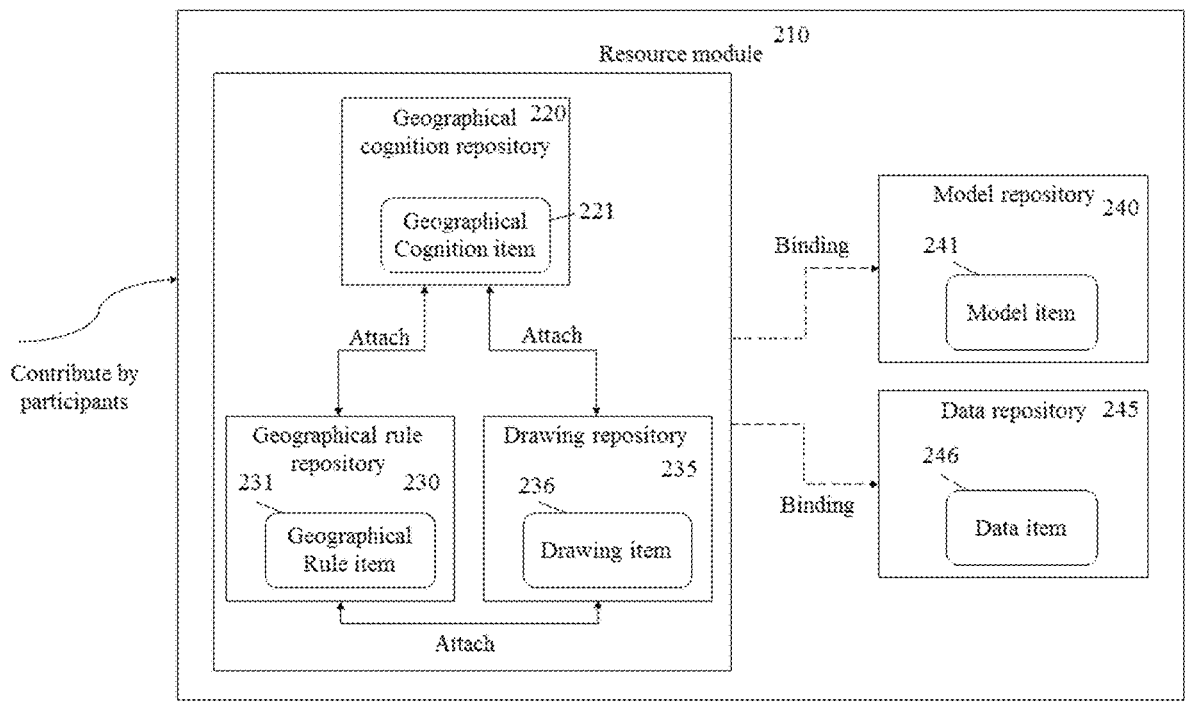
FIG. 5 is a schematic diagram of a resource module of a collaborative control device of the collaborative geographical modeling/simulating system according to an embodiment of the subject invention.

The resource connector 113 of the micro-geographical object 110 is configured to associate the micro-geographical object 110 with a corresponding virtual geographical cognition item 221 of the geographical cognition repository 220, a corresponding virtual geographical rule item 231 the geographical rule repository 230, a corresponding virtual drawing item 236 of the drawing repository 235, or a corresponding virtual model item 246 of the model repository 240 of the resource module 210 of FIG. 5.

In addition, the micro-geographical object 110 can be associated with the corresponding virtual resource items of the resource module 210 by either an active association or a passive association. For the active association, the micro-geographical object 110 directly requests the virtual resource items from the resource module 210 and the micro-geographical object 110 is associated with the virtual resource items through the sensor attributes of the physical attributes 111. On the other hand, for the passive association, the micro-geographical object 110 requests virtual resource items from the resource module 210 through the geographical conceptual modeling device 100. The geographical conceptual modeling device 100 provides means for the micro-geographical objects 110 to be associated with the virtual resource items of the resource module 210.

Referring again to FIG. 3, the device connector 115 is configured for communication between the micro-geographical object 110 and the geographical conceptual modeling device 100. The physical attributes 111 of the micro-geographical object 110 are registered with the geographical conceptual modeling device 100 through the device connector 115 such that the micro-geographical object 110 is passively associated with the virtual resource items through the geographical conceptual modeling device 100.

The operation-aware interface 117 of the micro-geographical object 110 is configured to collect the information of the operations performed on the micro-geographical object 110 such as moving, lifting, pinching, adding, removing, or overlapping, by microfilming the sensor attributes of the micro-geographical object 110. The information of the operations performed on the micro-geographical object 110 can then be provided to the geographical conceptual modeling device 100 through the device connector 115 such that the geographical conceptual modeling device 100 can transmit the operation information of the micro-geographical object 110 to the management module 250 of the collaborative control device 200.

Referring to FIG. 4, each micro-data object 120 of the geographical conceptual modeling device 100 can comprise physical attributes 121, a resource connector 123, a device connector 125, and an operation-aware interface 127.

The resource connector 123 of the micro-data object 120 is configured to associate the micro-data object 120 with a corresponding virtual geographical cognition item 221, a corresponding virtual geographical rule item 231, or a corresponding virtual drawing item 236 of the resource module 210. Moreover, the resource connector 123 of the micro-data object 120 can be configured to associate the micro-data object 120 with a corresponding virtual data item 246 of the resource module 210. However, unlike the micro-geographical object 110, the resource connector 123 of the micro-data object 120 is not configured to associate the micro-data object 120 with a corresponding virtual model item 241 of resource module 210.

In addition, the micro-data object 120 can be associated with the corresponding virtual resource items of the resource module 210 by either an active association or a passive association. For the active association, the micro-data object 120 directly requests the virtual resource items from the resource module 210 and the micro-data object 110 is associated with the virtual resource items through the sensor attributes of the physical attributes 121. On the other hand, for the passive association, the micro-data object 120 requests resource items from the resource module 210 through the geographical conceptual modeling device 100. The geographical conceptual modeling device 100 provides means for the micro-data object 120 to be associated with the virtual resource items of the resource module 210 for passive association.

In addition, the physical attributes 121, the device connector 125, and the operation-aware interface 127 of the micro-data object 120 work in the same way as the physical attributes 111, the device connector 115, and the operation-aware interface 117 of the micro-geographical object 110.

FIG. 5 is a schematic diagram of the resource module 210 of the collaborative control device 200 according to an embodiment of the subject invention. The resource module 210 can be configured to store and manage all virtual resource items for performing geographical analysis, geographical model construction, and geographical model simulation. The resource module 210 includes a geographical cognition repository 220, a geographical rule repository 230, a drawing repository 235, a model repository 240, and a data repository 245.

In one embodiment, the geographical cognition repository 220 can comprise at least one virtual geographical cognition item 221 virtually representing various elements of geographical environment. The geographical rule repository 230 can comprise at least one virtual geographical rule item 231 representing various geographical rules and laws of geographical environment. The drawing repository 235 can comprise at least one drawing item 236 representing various geographical elements and the geographical rules and laws in the geographical environment. The virtual resource items of the geographical cognition repository 220, the geographical rule repository 230, and the drawing repository 235 can be mutually attached to one another. For example, the geographical rule item 231 can be mutually attached to the geographical cognition item 221 or mutually attached to the drawing item 236.

Moreover, the micro-geographical objects 110 and the micro-data objects 120 of the geographical conceptual modeling device 100 can be associated with or mapped to any one of the at least one geographical cognition item 221, at least one geographical rule item 231, or the at least one drawing item 236.

The model repository 240 can comprise at least one virtual model item 241. The at least one virtual model item 241 includes computer code implementations for elements of geo-environment or a geographical process.

The data repository 245 can comprise at least one virtual data item 246 stored in data files for digitally representing the geographical cognition item 221 and the geographical rule item 231 of the geographical environment. The micro-data objects 120 can be associated with the at least one virtual data item 246, but cannot be associated with the at least one virtual model item 241; while the micro-geographical objects 110 can be associated with at least one virtual model item 241, but cannot be associated with the at least one virtual data item 246.

In one embodiment, the geographical cognition item 221 can be bound to the at least one model item 241 or the at least one data item 246; the geographical rule item 231 can be bound to the at least one model item 241 or the at least one data item 246; and the drawing item 236 can be bound to the at least one model item 241 or the at least one data item 246.

The micro-geographical object 110 can be associated with a corresponding geographical cognition item 221, or the geographical rule item 231, or the drawing item 236. When the corresponding geographic cognition item 221, or the geographical rule item 231, or the drawing item 236 is bound to a corresponding model item 241, the micro-geographical object 110 can be directly associated with the corresponding model item 241.

In addition, the micro-data objects 120 can be associated with a corresponding geographical cognition item 221, or the geographical rule item 231, or the drawing item 236. When the corresponding geographical cognition item 221, or the geographical rule item 231, or the drawing item 236 is bound to a corresponding data item 246, the micro-data object 120 can be directly associated with the corresponding data item 246.

In another embodiment, a user can dynamically contribute any type of virtual resource item to the resource module 210 such that the resource items contributed by the user can be shared with other users.

Figure 6:
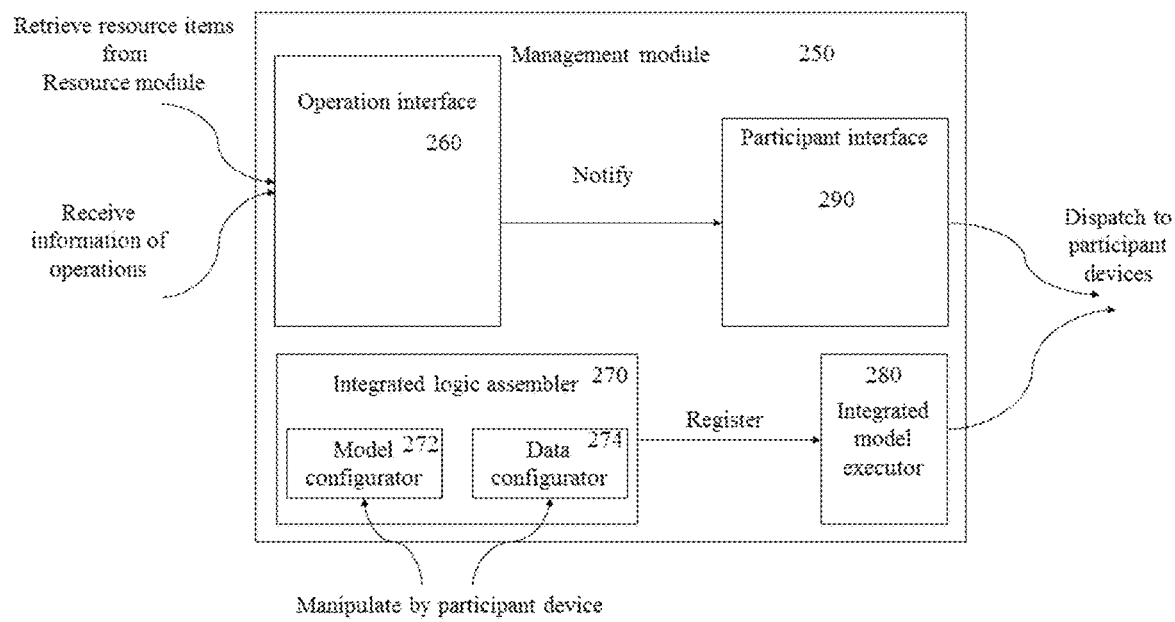
FIG. 6 a schematic diagram of a management module of the collaborative control device of the collaborative geographical modeling/simulating system according to an embodiment of the subject invention.

Referring to FIG. 6, the management module 250 of the collaborative control device 200 can be configured to aggregate information of virtual resource items provided by the resource module 210 and information of operations of the micro-geographical objects 110 and the micro-data objects 120, perform the geographical model construction and the geographical model simulation, and distribute the results of aggregation and the geographical model simulation to the participating device 300.

In one embodiment, the management module 250 can comprise an operation interface 260, an integrated logic assembler 270, an integrated model executor 280 coupled to the at least one participant device 300, and a participant interface 290 coupled to the at least one participant device 300.

The operation interface 260 is configured to receive the information of the operations of the micro-geographical objects 110 and the micro-data objects 120 from the geographical conceptual modeling device 100, and retrieve appropriate virtual resource items such as the virtual geographical cognition item 221 and the virtual geographical rule item 231 according to the associations of the corresponding micro-geographical objects 110 and micro-data object 120, a virtual drawing item 236, a virtual model item 241, or a virtual data item 246 from the resource module 210. Moreover, the operation interface 260 is configured to provide information requested by the integrated logic assembler 270.

The integrated logic assembler 270 is configured to logically deducing all resource items retrieved according to the retrieved geographical cognition item 221 and the retrieved geographical rule item 231 to integrate to construct a geographical model for simulation. To construct the geographical model for simulation, the integrated logic assembler 270 comprises two configurators: a model configurator 272 and a data configurator 274. The model configurator 272 configures the relevant operational requirements of the model and the data configurator 274 configures the dependency relationship between the model and the data. The participating users can configure the integrated logic assembler 270, for example, by adding, deleting, or modifying the parameters of the model configurator 272 or the parameters of the data configurator 274.

Moreover, the at least one participant device 300 can be configured to dynamically provide information to the integrated logic assembler 270 for adjusting and optimizing performance of the geographical analysis, the geographical model construction, and the geographical model simulation of the collaborative geographic modeling/simulating system 10. When there are more than one participant devices 300, the different participant devices 300 can simultaneously register the micro-geographical objects 110 and micro-data objects 120 with the integrated logic assembler 270 by identifying the geographical cognition item 221 and geographical rule item 231 associated with the micro-geographical objects 110 and the micro-data objects 120.

After all the associated resource items are retrieved, received, and integrated by the management module 250, the quantitative relationships between the plurality of micro-geographical objects 110 and the plurality of micro-data object 120 representing the geographical environment are analyzed and the rationality of the constructed geographical model is judged based on the retrieved geographical cognition item 221 and geographical rule item 231.

The results of the judgment are then integrated with the retrieved drawing item 236 that is associated with the micro-geographical objects 110 and micro-data objects 120 and provided to the participant interface 290 which then distributes the judgment results along with the operation information to the at least one participant device 300.

The integrated model executor 280 is configured to perform the simulation of the geographical model constructed by the integrated logic assembler 270, obtain the simulation results, and distribute the simulation results to the at least one participant device 300.

Figure 7:
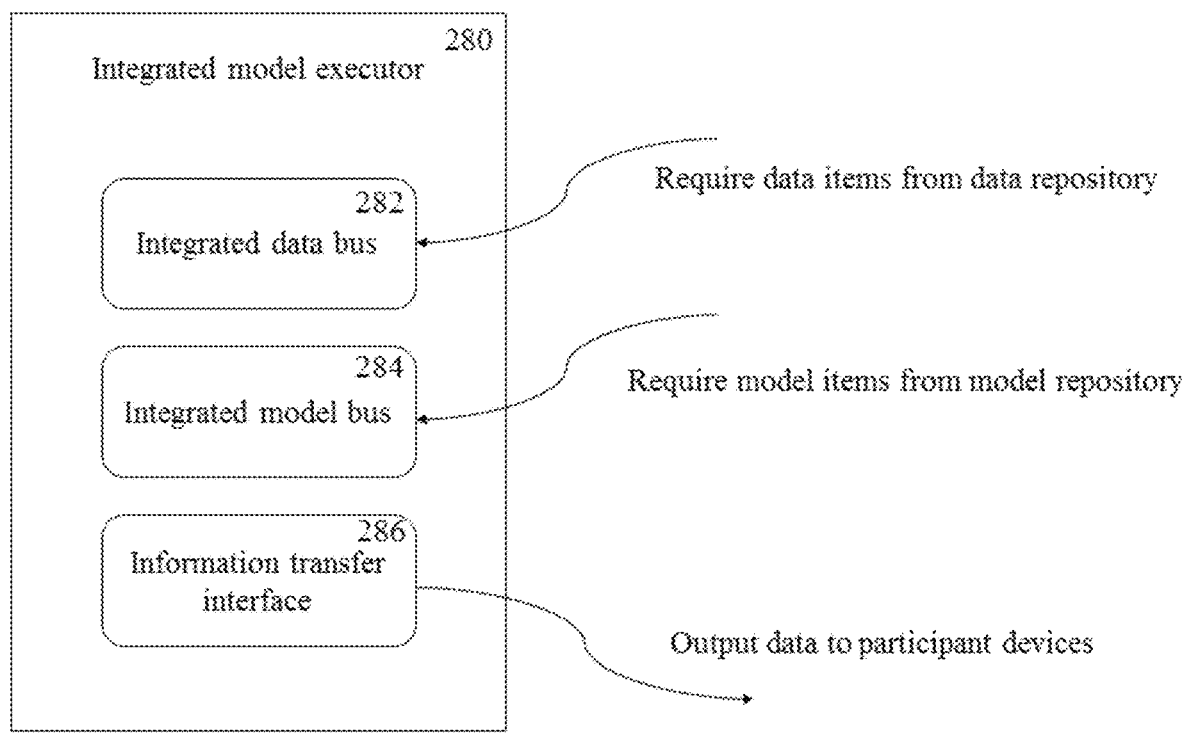
FIG. 7 a schematic diagram of an integrated model executor of the management module of the collaborative control device of the collaborative geographical modeling/simulating system according to an embodiment of the subject invention.

FIG. 7 is a schematic diagram of the integrated model executor 280 of the management module 250 according to an embodiment of the subject invention. The integrated model executor 280 can comprise an integrated data bus 282, an integrated model bus 284, and an information transfer interface 286 for performing the simulation of the geographical model. The integrated data bus 282 is configured to request virtual data items from the data repository 245 of the resource module 210 such that corresponding data can be configured for all models of the integration.

The integrated model bus 284 is configured to request the virtual model item 241 from the model repository 240 of the resource module 210 such that different models can be integrated according to the appropriate integration logic of the geographic simulation scenario.

The information transfer interface 286 is configured to manage input and output of each model and the data transferred between different models. Moreover, the information transfer interface 286 is configured to transmit the intermediate results and the final results of the geographical simulation to the at least one participant device 300 for visual presentation.

Figure 8:
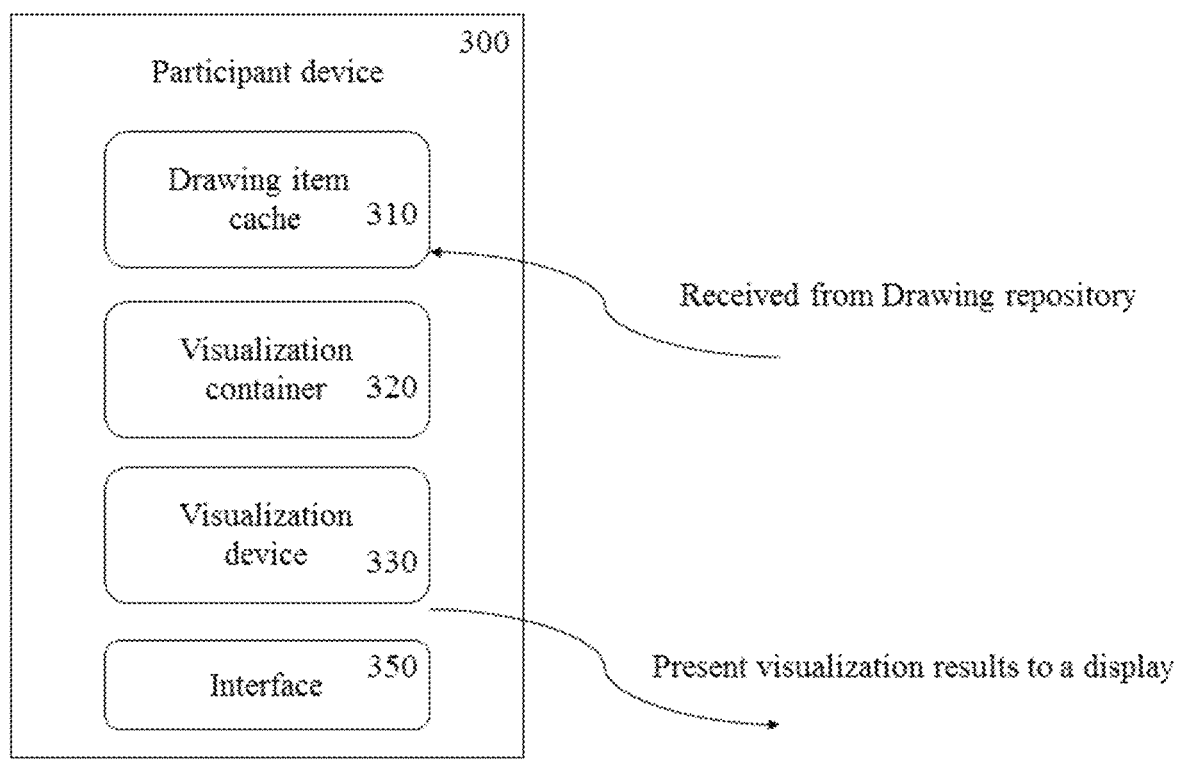
FIG. 8 is a schematic diagram of a participant device of the collaborative geographical modeling/simulating system according to an embodiment of the subject invention.

Referring to FIG. 8, the participant device 300 can comprise a drawing item cache 310, a visualization container 320, a visualization device 330 such as a display device, and an interface 350 for receiving operation information and the results of the geographical analysis, geographical model construction, and geographical model simulation transmitted from the collaborative control device 200.

The drawing item cache 310 is configured to receive the information of the operations of the micro-geographical objects 110 and the micro-data objects 120 transmitted by the management module 250, and request the association from resource module 210 according to the micro-geographical objects 110 and the micro-data objects 120. When the drawing item 236 is received, the drawing item 236 is cached by the drawing item cache 310 for the participant device 300 to render a visual presentation on the visualization device 330.

In addition, the visualization container 320 is configured to assemble all drawing items 236 received, create a visual scene, and present the visual scene to the visualization device 330. The visualization device 330 is configured to display the results of the visualization received from the visualization container 320.

Moreover, the at least one participant device 300 can be configured to dynamically provide information to the resource module 210 or the management module 250 of the collaborative control device 200 for adjusting and optimizing performance of the geographical analysis, the geographical model construction, and the geographical model simulation of the collaborative geographic modeling/simulating system 10.

In one embodiment, the at least one participant device 300 can be configured to dynamically add a new virtual resource item to the resource module 210, remove a virtual resource item from the resource module 210, or modify an existing virtual resource item of the resource module 210 for adjusting and optimizing the performance of the geographical analysis, the geographical model construction, and the geographical model simulation of the collaborative geographic modeling/simulating system 10.

In another embodiment, the at least one participant device 300 can be configured to dynamically add a new parameter of model configuration or data configuration to the management module 250, remove a parameter from the model configuration or data configuration of the management module 250, or modify an existing parameter of model configuration or data configuration of the management module 250 for adjusting and optimizing the performance of the geographical analysis, the geographical model construction, and the geographical model simulation of the collaborative geographic modeling/simulating system 10.

Figure 9:
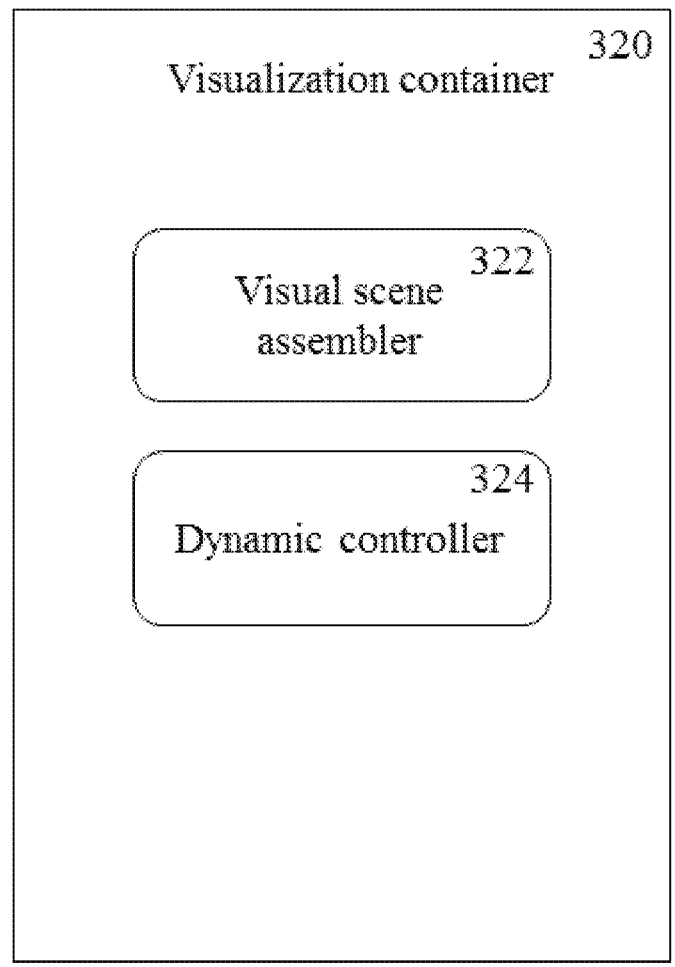
FIG. 9 shows a visualization container of the participant device of the collaborative geographical modeling/simulating system according to an embodiment of the subject invention.

Referring to FIG. 9, the visualization container 320 can comprise a visual scene assembler 322 and a dynamic controller 324 and be configured to receive the visual elements and integrate the visual elements into a visual scene for presentation on the visualization device 330. The dynamic controller 324 is configured to provide a time-varying parameter for the visualization container 320 and the time parameter information is provided to the visual scene assembler 322. Moreover, the visual scene assembler 322 can comprise four input interfaces and one output interface. The four input interfaces of the visual scene assembler 322 include: a micro-geographical object input interface, a micro-data object input interface, a geographical simulation scene operation result input interface, and a time parameter input interface.

In one embodiment, the micro-geographical object input interface is configured to receive the drawing item 236 associated with the micro-geographical objects 110 for providing to the visual scene assembler 322. The micro-data object input interface is configured for providing the drawing item 236 associated with the micro-data objects 120 to the visual scene assembler 322. The geographical simulation scene operation result input interface is configured to receive the result data output from the integrated model executor 280 and reconstruct the received data into the drawing item 236. The time parameter input interface is configured to receive the time parameters transmitted from the dynamic controller 324 to integrate the time parameters with all received drawing item 236 to create a dynamic visual presentation.

The output interface is a visual presentation output interface that transmits the constructed visual presentation to the visualization device 330.

When the at least one participant device 300 receives the operation information and the rationality judgment results, a visual expression is performed, and the rationality judgment results are presented to the user through the at least one participant device 300.

Accordingly, the users may operate on the participant device 300 to analyze the modeling results generated by the collaborative geographic modeling platform to analyze the past geographical phenomena, express the present geographical phenomena, and predict the future geographical phenomena.

Figure 10:
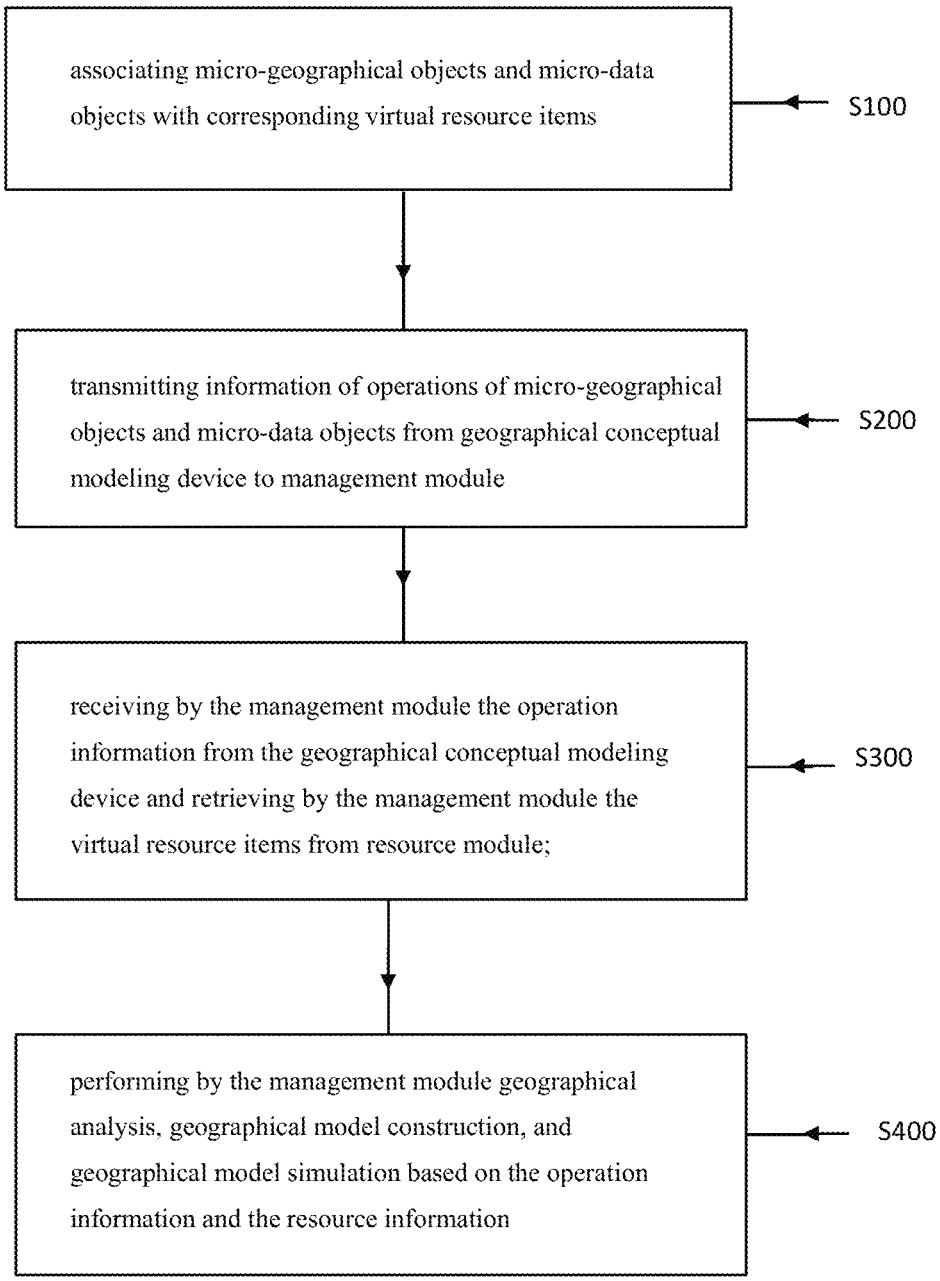
FIG. 10 shows a flow chart of operational processes of the collaborative geographical modeling/simulating system according to an embodiment of the subject invention.

FIG. 10 is a flow chart of operational processes of the collaborative geographical modeling/simulating system according to an embodiment of the subject invention. At step S100, the plurality of physically operable micro-geographical objects 110 and the plurality of physically operable micro-data objects 120 are associated with corresponding virtual resource items of the plurality of virtual resource items 221/231/236/241/246. Then, at step S200, the information of operations of both the micro-geographical objects 110 and the micro-data objects 120 are transmitted from the geographical conceptual modeling device 100 to the management module 250. Next, at step S300, when receiving the operation information from the geographical conceptual modeling device 100, the management module 250 retrieves resource information of the virtual resource items from the resource module 210. Further, at step S400, the management module 250 performs the geographical analysis, the geographical model construction, and the geographical model simulation based on the operation information received and the resource information retrieved.

As a person skilled in the art of geographical modeling will recognize from the previous detailed description and from the figures and claims, modifications and changes can be made to the embodiments of the invention without departing from the scope of this invention defined in the following claims.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application and the scope of the appended claims. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

REFERENCES b.i. U.S. Pat. No. 8,671,110 B1 Collaborative modeling environment
b.ii. U.S. Pat. No. 7,895,020 B2 System and method for multi-perspective collaborative modeling
b.iii. U.S. Pat. No. 7,535,473 B2 Collaborative environments in a graphical information system
b.iv. CN 105204631 B A kind of virtual geographical environment role modeling and multi-role cooperative operation method
b.v. CN 102707949 B Ontology-based visual concept modeling method
b.vi. US20150161904A1 Simulation platform module
b.vii. US20120208153A1 Systems and Methods Providing Distributed Training Simulations
b.viii. CN101901291B Experiment platform of virtual reality for traffic behavior and method thereof
c.i. TipChip: a modular, MEMS-based platform for experimentation and phenotyping of tip-growing cell

We claim:

1. A collaborative geographical modeling/simulating system comprising:
a geographical conceptual model creator/simulator comprising a plurality of physically operable micro-geographical objects and a plurality of physically operable micro-data objects; and
a collaborative controller coupled to the geographical conceptual model creator/simulator, comprising a resource module container having a plurality of virtual resource items and a management controller;
wherein the plurality of physically operable micro-geographical objects and the plurality of physically operable micro-data objects are configured to be associated with corresponding virtual resource items of the plurality of virtual resource items,
wherein the geographical conceptual model creator/simulator is configured to transmit operation information of both the plurality of physically operable micro-geographical objects and the plurality of physically operable micro-data objects to the management controller,
wherein the management controller is configured to receive the operation information from the geographical conceptual model creator/simulator, retrieve resource information of the plurality of virtual resource items from the resource container, and perform geographical analysis, geographical model construction, and geographical model simulation based on the operation information and the resource information.

2. The collaborative geographical modeling/simulating system of claim 1, further comprising at least one participant device coupled to the collaborative controller;
wherein the management controller is configured to transmit results of the geographical analysis, the geographical model construction, and the geographical model simulation to the at least one participant device,
wherein the at least one participant device is configured to receive the results of the geographical analysis, the geographical model construction, and the geographical model simulation and visually present the results on the display; and
wherein the at least one participant device is configured to dynamically provide information to the resource container or the management controller of the collaborative controller for adjusting and optimizing performance of the geographical analysis, the geographical model construction, and the geographical model simulation.

3. The collaborative geographical modeling/simulating system of claim 2, wherein the participant device comprises a drawing item cache, a visualization container, a visualization device, and an interface for communication.

4. The collaborative geographical modeling/simulating system of claim 1, wherein the plurality of virtual resource items comprises at least one geographical cognition item, at least one geographical rule item, at least one drawing item, at least one model item, and at least one data item.

5. The collaborative geographical modeling/simulating system of claim 4, wherein the at least one geographical cognition item, the at least one geographical rule item, and the at least one drawing item are mutually attached to one another.

6. The collaborative geographical modeling/simulating system of claim 4, wherein the at least one geographical cognition item is bound to the at least one model item or the at least one data item; the at least one geographical rule item is bound to the at least one model item or the at least one data item; and the at least one drawing item is bound to the at least one model item or the at least one data item.

7. The collaborative geographical modeling/simulating system of claim 1, wherein the management controller comprises an operation interface, an integrated logic assembler, an integrated model executor, and a participant interface.

8. The collaborative geographical modeling/simulating system of claim 7, wherein the integrated model executor comprises an integrated data bus, an integrated model bus, and an information transfer interface.

9. The collaborative geographical modeling/simulating system of claim 1, wherein each of the plurality of physically operable micro-geographical objects comprises physical attributes, a resource connector, a device connector, and an operation-aware interface.

10. The collaborative geographical modeling/simulating system of claim 1, wherein each of the plurality of physically operable micro-data objects comprises physical attributes, a resource connector, a device connector, and an operation-aware interface.

11. The collaborative geographical modeling/simulating system of claim 1, wherein the plurality of physically operable micro-geographical objects are configured to be associated with the corresponding virtual resource items of the plurality of virtual resource items by either an active association or a passive association.

12. The collaborative geographical modeling/simulating system of claim 1, wherein the plurality of physically operable micro-data objects are configured to be associated with the corresponding virtual resource items of the plurality of virtual resource items by either an active association or a passive association.

13. A method for a collaborative geographical modeling/simulating system that comprises a geographical conceptual model creator/simulator comprising a plurality of physically operable micro-geographical objects and a plurality of physically operable micro-data objects, a collaborative controller coupled to the geographical conceptual model creator/simulator and comprising a resource container having a plurality of virtual resource items and a management controller, the method comprising:

associating the plurality of physically operable micro-geographical objects and the plurality of physically operable micro-data objects with corresponding virtual resource items of the plurality of virtual resource items;

transmitting, by the geographical conceptual model creator/simulator, operation information of both the plurality of physically operable micro-geographical objects and the plurality of physically operable micro-data objects to the management controller;

receiving, by the management controller, the operation information from the geographical conceptual model creator/simulator;

retrieving, by the management controller, resource information of the plurality of virtual resource items from the resource container; and performing, by the management controller, geographical analysis, geographical model construction, and geographical model simulation based on the operation information and the resource information.

14. The method for the collaborative geographical modeling/simulating system of claim 13, further comprising:

providing at least one participant device coupled to the collaborative controller and comprising a display;

transmitting, by the management controller, results of the geographical analysis, the geographical model construction, and the geographical model simulation to the at least one participant device;

receiving, by the at least one participant device, the results from the management controller; and visually presenting, by the at least one participant device, the results on the display.

15. The method for the collaborative geographical modeling/simulating system of claim 14, further comprising:

dynamically providing, by the at least one participant device, information to the resource container or the management controller of the collaborative controller.

16. The method for the collaborative geographical modeling/simulating system of claim 15, further comprising:

receiving, by the collaborative controller, the information from the at least one participant device; and adjusting and optimizing, by the collaborative controller, performance of the geographical analysis, the geographical model construction, and the geographical model simulation based on the information received from the at least one participant device.

17. The method for the collaborative geographical modeling/simulating system of claim 13, wherein the associating the plurality of physically operable micro-geographical objects with the corresponding virtual resource items comprises an active associating or a passive associating.

18. The method for the collaborative geographical modeling/simulating system of claim 13, wherein the associating the plurality of physically operable micro-data objects with the corresponding virtual resource items comprises an active associating or a passive associating.

19. The method for the collaborative geographical modeling/simulating system of claim 13, further comprising:

configuring the plurality of virtual resource items to comprise at least one geographical cognition item, at least one geographical rule item, at least one drawing item, at least one model item, and at least one data item; and mutually attaching the at least one geographical cognition item, the at least one geographical rule item, and the at least one drawing item to one another.

20. The method for the collaborative geographical modeling/simulating system of claim 19, further comprising:

binding the at least one geographical cognition item to the at least one model item or the at least one data item, the at least one geographical rule item to the at least one model item or the at least one data item, and the at least one drawing item to the at least one model item or the at least one data item.

* * * * *